(12) United States Patent
Kim

(10) Patent No.: US 9,821,416 B2
(45) Date of Patent: Nov. 21, 2017

(54) MASK ASSEMBLY AND METHOD FOR FABRICATING THE SAME

(71) Applicant: SAMSUNG DISPLAY CO., LTD., Yongin, Gyeonggi-Do (KR)

(72) Inventor: Yong Hwan Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 432 days.

(21) Appl. No.: 14/058,404

(22) Filed: Oct. 21, 2013

(65) Prior Publication Data

US 2014/0331926 A1 Nov. 13, 2014

(30) Foreign Application Priority Data

May 8, 2013 (KR) .......................... 10-2013-0051975

(51) Int. Cl.
| B05C 21/00 | (2006.01) |
| B23K 31/02 | (2006.01) |
| B23K 37/04 | (2006.01) |
| C23C 14/04 | (2006.01) |

(52) U.S. Cl.
CPC ........ *B23K 37/0408* (2013.01); *B05C 21/005* (2013.01); *C23C 14/042* (2013.01)

(58) Field of Classification Search
None
See application file for complete search history.

(56) References Cited

U.S. PATENT DOCUMENTS

| 6,589,382 B2 * | 7/2003 | Clark | .................... C23C 14/042 |
| | | | 118/504 |
| 8,915,215 B1 | 12/2014 | Park | |
| 2012/0174863 A1 * | 7/2012 | Park | ...................... C23C 14/042 |
| | | | 118/504 |

FOREIGN PATENT DOCUMENTS

| CN | 102593376 | 7/2012 |
| KR | 1020000017567 | 3/2000 |
| KR | 1020080058602 | 6/2008 |
| KR | 1020090052203 | 5/2009 |
| KR | 1020090123590 | 12/2009 |
| KR | 1020120080857 | 7/2012 |

OTHER PUBLICATIONS

Chinese Office Action dated Jul. 24, 2017 For Chinese Patent Application 20140008606.X.

\* cited by examiner

*Primary Examiner* — Dah-Wei D Yuan
*Assistant Examiner* — Jethro M Pence
(74) *Attorney, Agent, or Firm* — F. Chau & Associates, LLC

(57) ABSTRACT

A mask assembly includes a mask frame having frame openings formed thereon, and a plurality of unit masks fixed to the mask frame. The respective unit masks extend in a first direction, and at least one of the plurality of unit masks includes at least one of a one sided projection projecting to one side thereof and another sided projection projecting to another side thereof, at both end portions of the unit mask, in a second direction that crosses the first direction.

11 Claims, 15 Drawing Sheets

MASK ASSEMBLY AND METHOD FOR FABRICATING THE SAME

CROSS-REFERENCE TO RELATED APPLICATIONS

This application is based on and claims priority from Korean Patent Application No. 10-2013-0051975, filed on May 8, 2013, the disclosure of which is hereby incorporated by reference herein in its entirety.

1. TECHNICAL FIELD

The present disclosure relates to a mask assembly and a method for fabricating the same.

2. DISCUSSION OF THE RELATED ART

As flat panel displays, a liquid crystal display (LCD) and an organic light emitting display (OLED) have been widely used. The flat panel display includes a metal layer of a specific pattern, and in the case of the organic light emitting display, an organic light emitting layer of a specific pattern is formed for each pixel. As a method for forming a metal layer and an organic light emitting layer, a deposition method using a mask assembly may be applied.

The mask assembly may include a mask having openings corresponding to a pattern of a metal layer or an organic light emitting layer, and a mask frame supporting the mask. For example, in a divided mask method, a mask is divided into a plurality of unit masks in a band shape, and the respective unit masks are fixed to the mask frame by welding in a state where the unit masks are extended in a length direction. The divided mask method has benefits such as, for example, that good products can be selectively used and repairs thereon can be readily made.

SUMMARY

Unit masks may be extended in the length direction and may be fixed to a mask frame. In this case, however, contraction phenomenon may occur in a direction that is orthogonal to the extension direction, that is, in the width direction, and this may cause waves to occur on the whole mask. The waves that occur on the mask become severer as the width of the unit mask becomes larger.

Further, end portions of both sides of the unit mask are fixed to clamps and extended, and as the unit mask itself is formed of a thin metal plate material, the unit mask may not be able to endure a pulling force of the clamp, and thus waves may occur around the end portion fixed to the clamp. The waves occurring on the end portion of the unit mask may reach even a center portion of the unit mask on which the opening is formed to cause deposition inferiority.

On the other hand, the unit mask is fixed to the mask frame by welding, and at this time, force that partially pulls the unit mask occurs around the welding point, and thus waves may occur on the unit mask around the welding point. The waves occurring around the welding point of the unit mask are extended up to the center portion of the unit mask to cause the deposition inferiority.

Exemplary embodiments of the present invention provide a mask assembly, which can heighten deposition quality of a thin film through suppression of the occurrence of waves on a unit mask.

Exemplary embodiments of the present invention provide a method for fabricating a mask assembly, which can heighten deposition quality of a thin film through suppression of the occurrence of waves on a unit mask.

According to an exemplary embodiment of the present invention, there is provided a mask assembly including a mask frame having frame openings formed thereon and a plurality of unit masks fixed to the mask frame. The respective unit masks extend in a first direction, and at least one of the plurality of unit masks includes at least one of a one sided projection projecting to one side thereof and another sided projection projecting to another side thereof at both end portions of the unit mask, in a second direction that crosses the first direction.

According to an exemplary embodiment of the present invention, there is provided a mask assembly including a mask frame having frame openings formed thereon, and a plurality of unit masks fixed to the mask frame. The respective unit masks are extended in a first direction, and a width of an outmost portion of the unit masks in the first direction is larger than a width of a center portion of the unit masks.

According to an exemplary embodiment of the present invention, there is provided a method for fabricating a mask assembly which includes preparing a mask frame on which a plurality of extension units are installed and a plurality of unit masks including clamping portions projecting from both end portions thereof in a first direction and projections projecting from the both end portions thereof in a second direction that crosses the first direction, extending the clamping portion of any one of the plurality of unit masks on the mask frame in the first direction, fixing the projection of the unit mask that is extended in the first direction to a movement member of the extension unit, extending the projection of the unit mask in the second direction through movement of the movement member in the second direction, fixing both end portions of the unit mask that is extended in the second direction to the mask frame, and separating the clamping portion of the unit mask to which the both end portions are fixed.

According to an exemplary embodiment of the present invention, a mask assembly is provided. The mask assembly includes a mask frame defining an outer frame of the mask assembly and including an opening therein and a concave groove in a side thereof, and a plurality of unit masks fixed to the mask frame. The respective unit masks extend in a first direction, and at least one of the plurality of unit masks includes at least one of a one sided projection projecting to a first side thereof and another sided projection projecting to another side thereof at both end portions of the unit mask, in a second direction that crosses the first direction.

The mask assembly further includes an extension unit disposed within the concave groove of the mask frame between two neighboring unit masks. The extension unit includes a guide rail disposed in a line in the second direction on a bottom of the concave groove, a movement member coupled to the guide rail, and a movement control portion disposed on a sidewall of the movement member and configured to control the movement of the movement member. The movement member is coupled to the guide rail and configured to slide in the second direction in the concave groove, and the movement control portion includes a rack coupling portion having a rack and a driving shaft having a pinion configured engage with the rack, and a guide coupling portion disposed on sidewall of the concave groove and configured to guide the movement of the rack coupling portion by coming in surface contact with the rack coupling portion in the second direction.

In addition, the mask assembly further includes a welding portion including a first welding portion configured to fix the projections and the extension unit to each other by welding, and a second welding portion configured to fix the both end portions of the respective unit masks and the mask frame to each other by welding.

According to embodiments of the present invention, at least the following benefits can be achieved.

As the mask assembly according to an embodiment of the present invention is extended in the first direction, the plurality of unit masks, on which waves occur, are extended in the second direction to effectively remove the waves. Accordingly, deformation of the openings of the patterns of the plurality of unit masks due to the waves can be suppressed, and thus the deposition quality of the thin film can be increased.

Further, as the mask assembly according to an embodiment of the present invention fixes projections, which project in the second direction from both end portions of at least one of the plurality of unit masks, to the extension unit, the unit masks can stably maintain the extended state in the second direction even after the forming of the mask assembly is completed.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Exemplary embodiments of the present invention may, however, be embodied in many different forms and should not be construed as being limited to exemplary embodiments set forth herein.

It will also be understood that when a layer is referred to as being "on" another layer or substrate, it can be directly on the other layer or substrate, or intervening layers may also be present. The same reference numbers indicate the same components throughout the specification.

As used herein, the term "and/or" includes any and all combinations of one or more of the associated listed items. Also, as used herein, the singular forms "a," "an" and "the" are intended to include the plural forms as well, unless the context clearly indicates otherwise.

Hereinafter, exemplary embodiments of the present invention will be described in detail with reference to the accompanying drawings.

Figure 1:
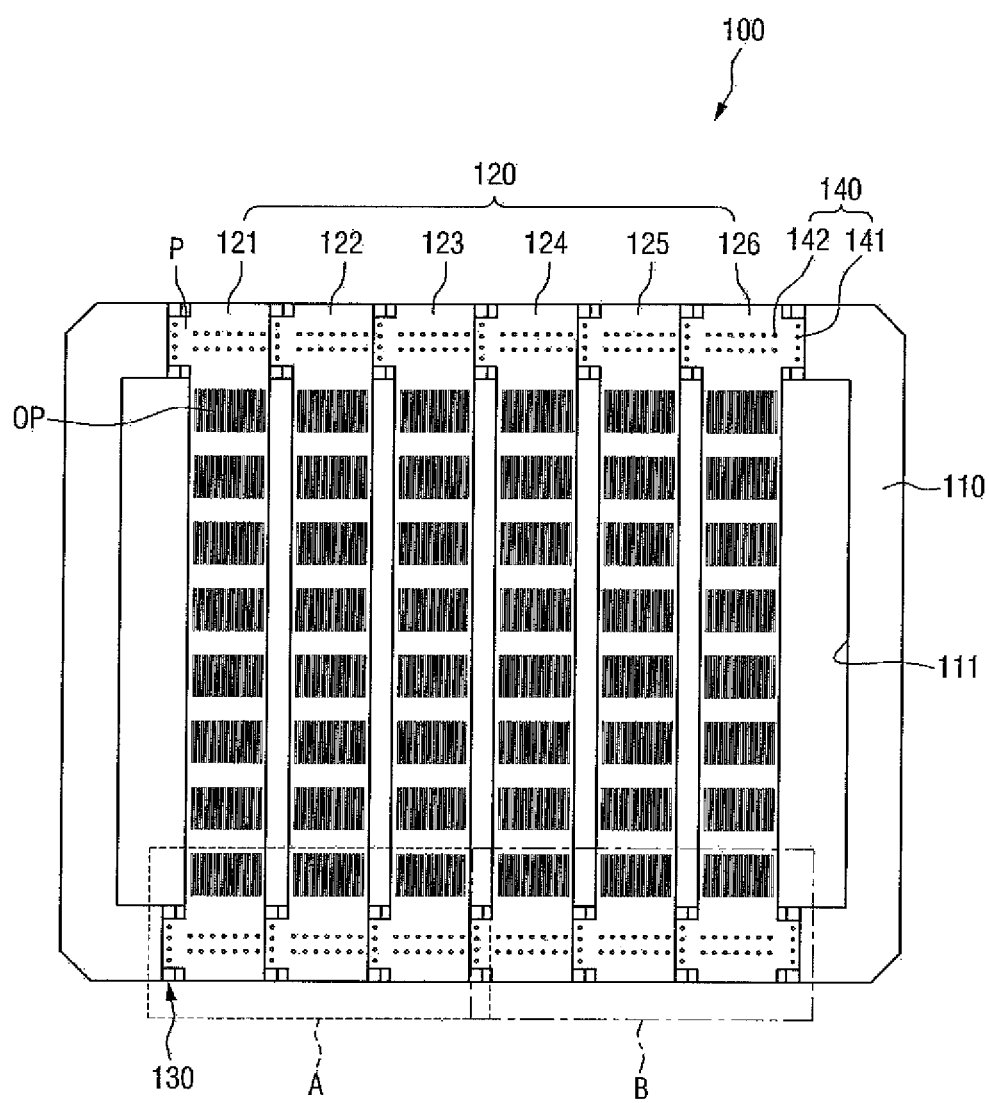
FIG. 1 is a plan view of a mask assembly according to an embodiment of the present invention.
Figure 2:
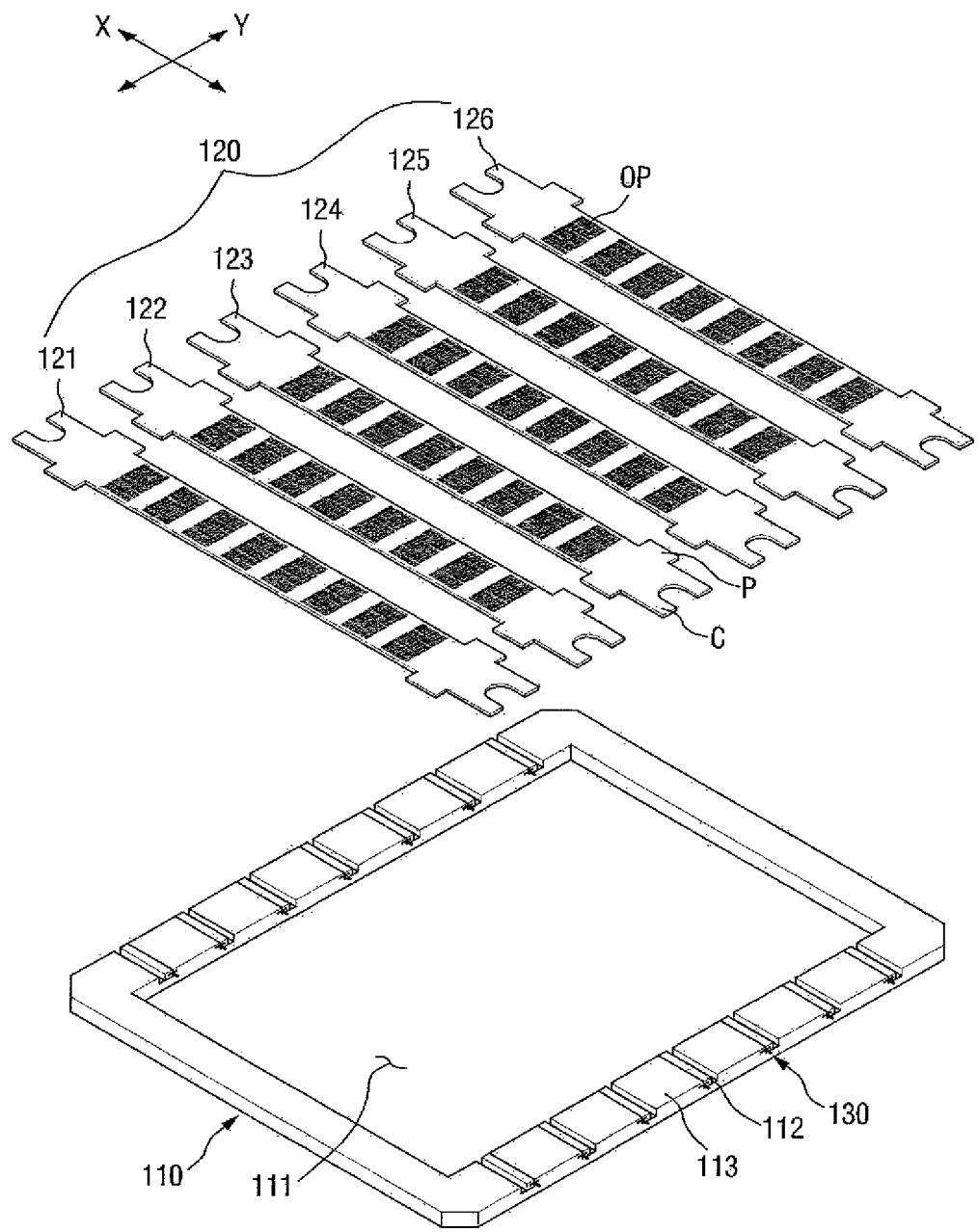
FIG. 2 is a perspective view of a mask frame and a plurality of unit masks, which are provided to form the mask assembly of FIG. 1.
Figure 3:
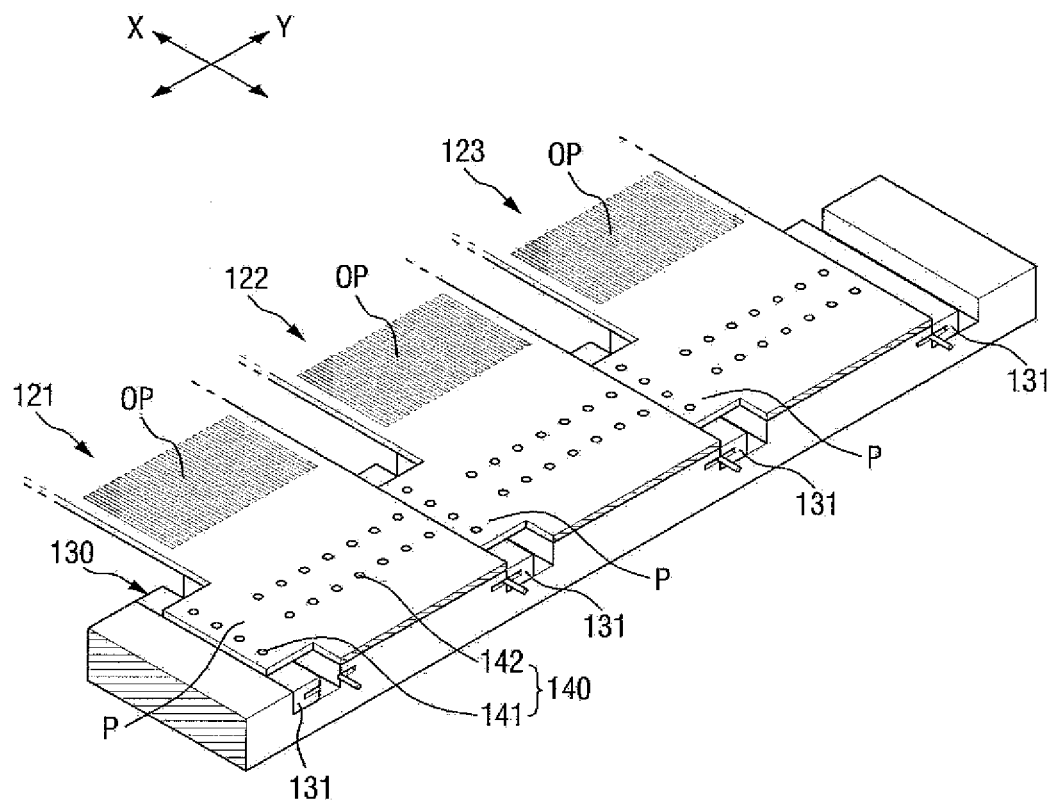
FIG. 3 is an enlarged perspective view of portion "A" of FIG. 1.
Figure 4:
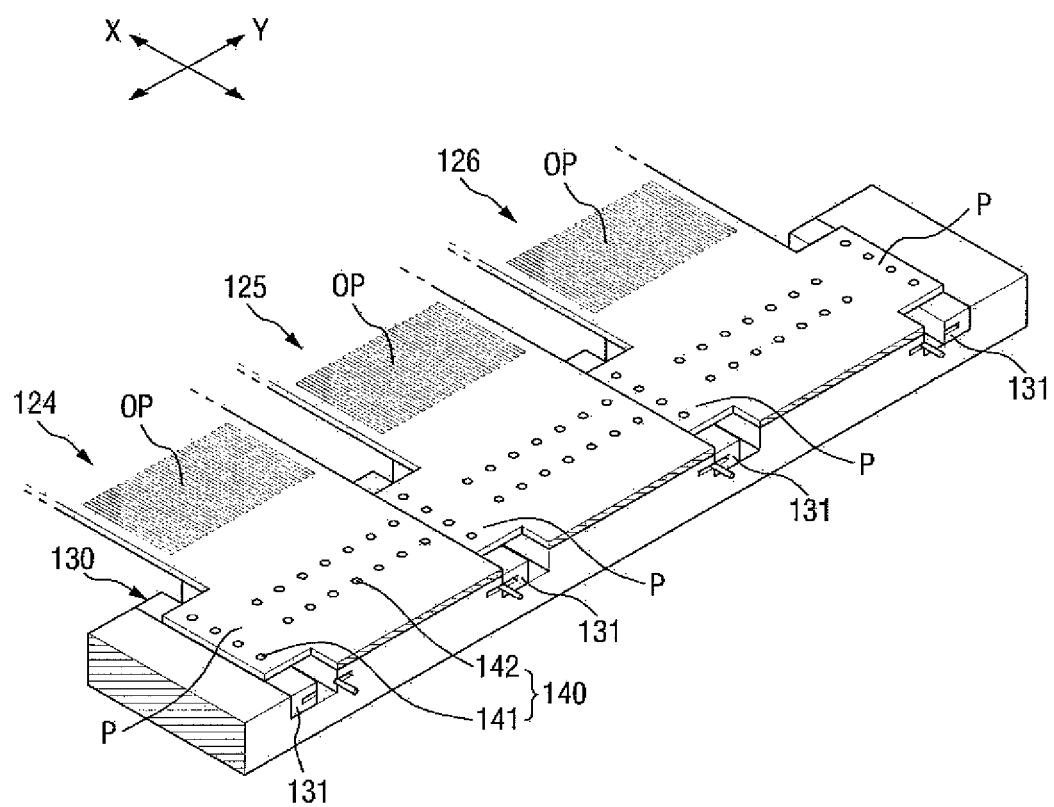
FIG. 4 is an enlarged perspective view of portion "B" of FIG. 1.
Figure 5:
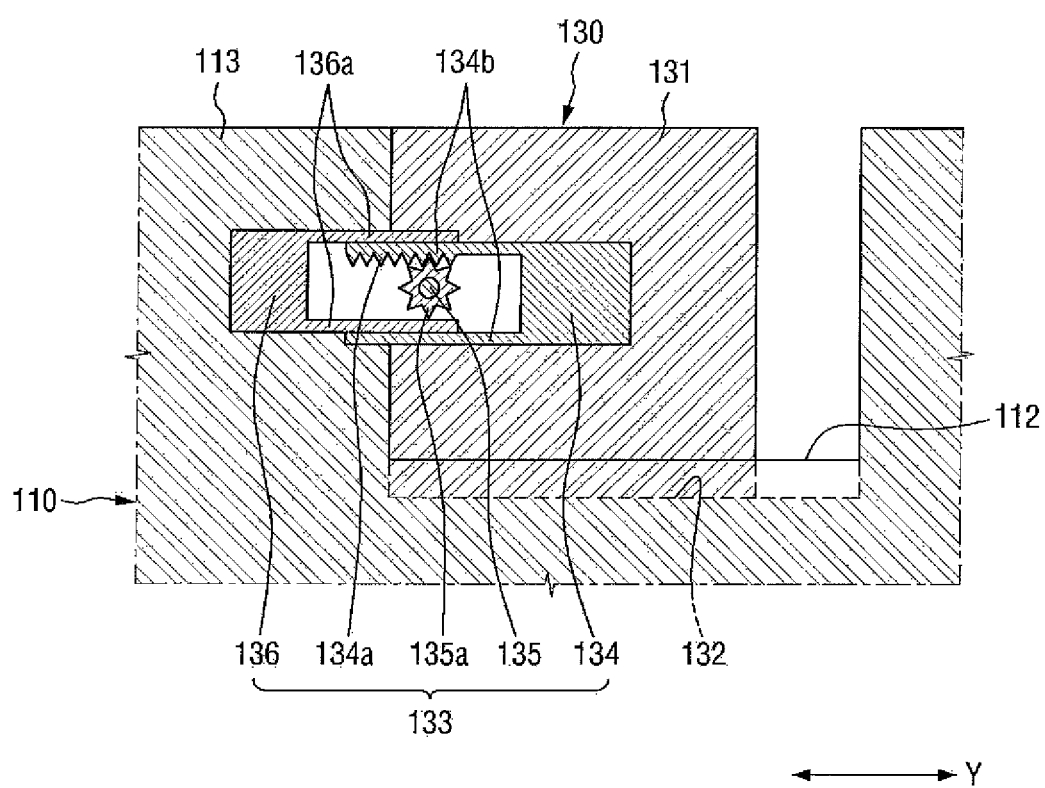
FIG. 5 is a cross-sectional view of an extension unit illustrated in FIG. 1.
Figure 6:
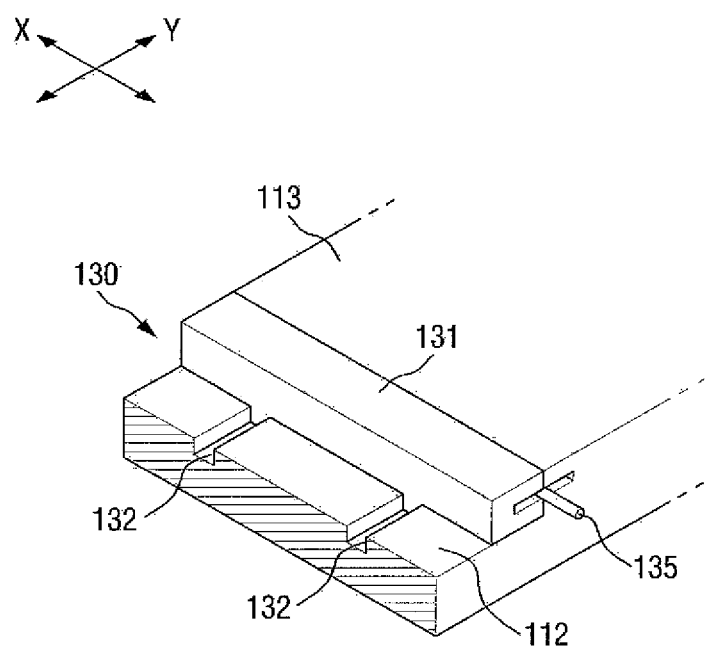
FIG. 6 is a partial perspective view of an extension unit illustrated in FIG. 1.

FIG. 1 is a plan view of a mask assembly according to an embodiment of the present invention, and FIG. 2 is a perspective view of a mask frame and a plurality of unit masks, which are provided to form the mask assembly of FIG. 1. FIG. 3 is an enlarged perspective view of portion "A" of FIG. 1, and FIG. 4 is an enlarged perspective view of portion "B" of FIG. 1. FIG. 5 is a cross-sectional view of an extension unit illustrated in FIG. 1, and FIG. 6 is a partial perspective view of an extension unit illustrated in FIG. 1.

Referring to FIG. 1, a mask assembly 100 according to an embodiment of the present invention includes, for example, a mask frame 110, a plurality of unit masks 120, a plurality of extension units 130, and a plurality of welding portions 140.

The mask frame 110 forms an outer frame of the mask assembly 100, and may have, for example, a rectangular band shape which a frame opening 111 is formed in the center thereof. The mask frame 110 supports the plurality of unit masks 120, and may be coupled to the plurality of unit masks 120 by, for example, welding. Further, referring to FIG. 2, the mask frame 110 may include, for example, a plurality of concave grooves 112 that are formed on sides where the plurality of unit masks 120 are welded. The concave groove 112 provides a space in which the extension unit 130 is installed. Here, on surfaces 113 of the mask frame 110, on which the concave grooves 112 are not formed, the plurality of unit masks 120 are fixed by, for example, welding. The mask frame 110 may be formed of a metal material having high strength such as, for example, stainless steel, aluminum (Al), steel, Electrogalvanized, Cold Rolled, Coil (SECC), or the like.

The plurality of unit masks 120 are, for example, in a band shape with predetermined length and width. In the description, the length direction of the plurality of unit masks 120 is defined as, for example, a first direction X, and the width direction of the plurality of unit masks 120 is defined as a second direction Y. The angle between the first direction X and the second direction Y may be, for example, at right angles. The plurality of unit masks 120 are configured to extend, for example, in the first direction X. Each of the plurality of unit masks 120 is fixed to the mask frame 110 by, for example, welding to be supported by the mask frame 110 in a state where a tension force is applied to both end portions of the unit mask 120 in the first and second directions X and Y. That is, the plurality of unit masks 120 are extended, for example, not only in the first direction X but also in the second direction Y. Accordingly, waves, which may be caused by the tension in the first direction X, may be prevented or mitigated by the extension in the second direction Y. The plurality of unit masks 120 may be arranged, for example, in a line on the mask frame 110 in the second direction Y.

Each of the plurality of unit masks 120 includes, for example, a plurality of pattern openings OP. The plurality of pattern openings OP are positioned, for example, in a line to be spaced apart from each other in the first direction X. The plurality of pattern openings OP may be arranged, for example, in the frame opening 111. Each of the pattern openings OP includes, for example, a plurality of fine openings, and the plurality of fine openings may be configured to correspond to the shape of a thin film to be deposited on a substrate (not illustrated) that is arranged on the plurality of unit masks 120. Accordingly, in a deposition process, a deposition material is, for example, deposited on the substrate through the pattern openings OP, and a thin film (e.g., an organic light emitting layer or a metal layer) having a desired shape may be formed.

One pattern opening OP may correspond to, for example, one flat panel display (e.g., organic light emitting display). In this case, patterns, which correspond to a plurality of flat panel displays, may be, for example, simultaneously deposited through a single process using one mask assembly 100. That is, the mask assembly 100 corresponds to one mother substrate, and the patterns, which correspond to the plurality of flat panel displays, are simultaneously formed on the mother substrate. It is noted that exemplary embodiments of the present invention are not limited to simultaneously depositing the patterns through a single process using the one mask assembly 100.

The plurality of unit masks 120 may include, for example, a first unit mask 121, a second unit mask 122, a third unit mask 123, a fourth unit mask 124, a fifth unit mask 125, and a sixth unit mask 126. In this embodiment, 6 unit masks 120 are exemplified. However, the number of unit masks 120 is not limited thereto, and thus in exemplary embodiments more than 6 unit masks 120 or less than 6 unit masks 120 may be used.

For example, before the mask frame 110 is installed, clamping portions C, which project in the first direction X to be coupled to clamps (not illustrated) that apply extension force in the first direction X as illustrated in FIG. 2, may be formed at both end portions of the unit masks 121 to 126. It is noted that exemplary embodiments of the present invention are not limited to the clamping portions C described herein but rather other elements which are suitable for performing the above-mentioned functions of the clamping portions C may be utilized as well. After the unit masks 121 to 126 are installed on the mask frame 110, the clamping portions C may be, for example, cut and removed.

Further, before being installed on the mask frame 110, the unit masks 121 to 126 may include, for example, projections P projecting to one side and the other side in the second direction Y from both end portions thereof. For example, the projections projecting to one side in the second direction Y from both end portions of the respective unit masks 121 to 126 are defined as one sided projections P, and the projections projecting to the other side are defined as the other sided projections P. After being installed on the mask frame 110, at least one of the plurality of unit masks 120 may include, for example, at least one of the one sided projection P and the other sided projection P, which are provided at both end portions of the unit mask 120. The projections P are fixed to extension units 130, and thus the unit masks 120 can be stably kept in an extended state in the second direction Y even after the forming of the mask assembly 100 is completed.

Parts of the projections P of the respective unit masks 121 to 126 may be removed after the unit masks 121 to 126 are installed on the mask frame 110. For example, when the third unit mask 123 and the fourth unit mask 124, which neighbor with each other, are installed on the mask frame 110, the projection P projecting to the other side in the second direction Y (the fourth unit mask direction) from the both end portions of the third unit mask 123 may, for example, overlap the projection P projecting to the one side in the second direction. Y (the third unit mask direction) from the both end portions of the fourth unit mask 124. As they are extended commonly using one extension unit 130, at least one of the projections P between the neighboring unit masks may be cut after being extended by the extension unit 130. FIG. 1 exemplarily illustrates a case where one sided projections P of the first to fifth unit masks 121 to 125 remain, but the other sided projections P thereof are removed. For example, if the third unit mask 123 includes the one sided projection P at one end portion thereof, the fourth unit mask 124 may not include the other sided projection P at one end portion thereof. Further, if the third unit mask 123 includes the other sided projection P at one end portion thereof, the fourth unit mask 124 may, for example, not include the one sided projection P at one end portion thereof. On the other hand, at least one of the first unit mask 121 positioned on the outermost side (called the first outermost unit mask) and the sixth unit mask 126 (called the second outermost unit mask) may include, for example, both the one sided projection P and the other sided projection P at one end portion thereof. For example, as the other sided projection P of the sixth unit mask 126 does not overlap the projection of the other unit mask, not only the one sided projection P but also the other sided projection P of the sixth unit mask 126 may remain even after the sixth unit mask 126 is installed on the mask frame 126. The projection distance of the projection may be, for example, no greater than the separation distance of the neighboring unit mask.

Alternatively, in an exemplary embodiment, all of the one sided projections P and the other sided projections P may be cut and separated from the plurality of unit masks in the manufacturing process and thus the completed mask assembly does not include any projections.

The plurality of extension units 130 are installed, for example, on two sides of the mask frame 110 on which both end portions of the plurality of unit masks 120 are fixed, and are positioned at a distance from each other in the second direction Y. The plurality of extension units 130 move, for example, in the second direction Y in predetermined spaces, and extend both end portions of the plurality of unit masks 120, specifically, the respective projections P of the plurality of unit masks 120 illustrated in FIG. 2, in the second direction Y. Accordingly, waves caused by respectively extending the plurality of unit mask in the first direction X may be mitigated. The plurality of extension units 130 may be, for example, respectively fixed to the plurality of unit masks 120 by welding.

Referring to FIGS. 3 and 4, the plurality of extension units 130 may respectively include, for example, movement members 131 that move along the second direction Y within predetermined spaces. The movement members 131 are, for example, substantially fixed to the respective projections P of the plurality of unit masks 120, and extend the projections P of the plurality of unit masks 120 to remove the waves occurring on the plurality of unit masks 120. After the extension in the second direction Y, parts of the projections P may be removed from the plurality of unit masks 120. A process of removing waves from the plurality of unit masks 120 using the projections P and the plurality of extension units 130 will be described in detail in a method for fabricating a mask assembly 100 to be described later.

The plurality of extension units 130 are positioned, for example, on both sides (left and right sides) of the plurality of unit masks 120. In this case, as two neighboring unit masks (e.g., 121 and 122) can be successively fixed to one extension unit 130, the one extension unit 130 is positioned between the two neighboring unit masks (e.g., 121 and 122).

Accordingly, the plurality of extension units 130 are positioned to, for example, correspond to spaces between the plurality of unit masks 120 and outer spaces of the outermost unit masks 121 and 126. That is, for example, if it is assumed that the number of plurality of unit masks 120 is n, (n+1)-numbered extension units 130 are provided on one side of the mask frame 110. As one extension unit 130 is positioned between two neighboring unit masks (e.g., 121 and 122, unnecessary space expansion can be minimized, and gaps between the plurality of unit masks 120 can be reduced. Accordingly, the number of patterns that can be formed on one mother substrate can be increased by increasing the number of pattern openings provided in one mask assembly 100.

Referring to FIGS. 5 and 6, each of the plurality of extension units 130 may include, for example, a guide rail 132 formed in a concave groove 112, a movement member 131 coupled to the guide rail 132, and a movement control portion 133 controlling the movement of the movement member 131.

The guide rail 132 is formed, for example, in a line in the second direction Y on the bottom of the concave groove 112, and is provided in the form of a groove or a protrusion. FIG. 5 exemplarily illustrates a case where two guide rails 132 in the form of grooves are formed on the bottom of the concave groove 112, but the number and the shape of the guide rails 132 are not limited to those exemplarily illustrated.

The movement member 131 is, for example, coupled to the guide rail 132, and slides in the second direction Y in the concave groove 112. The movement member 131 may have, for example, a protrusion-groove coupling structure with the guide rail 132. The width of the movement member 131 is set to be, for example, smaller than the width of the concave groove 112, and thus the movement member 131 moves leftward and rightward in the concave groove 112. The surface of the movement member 131 has, for example, the same height as the surface 113 of the mask frame 110.

The movement control portion 133 is, for example, coupled to the movement member 131, and controls the movement of the movement member 131 in the second direction Y. For example, the movement control portion 133 is installed on a side wall of the movement member 131, and may include a rack coupling portion 134 having a rack 134a, and a driving shaft 135 having a pinion 135a that is engaged with the rack 134a. The driving shaft 135 is, for example, positioned between one side wall of the concave groove 112 and the movement member 131, and may be engaged with an external power source (not illustrated) to be rotated in a state where the driving shaft 135 is supported by the mask frame 110.

If the driving shaft 135 is rotated clockwise on the basis of FIG. 5, the rack coupling portion 134 is, for example, pushed out of the side wall of the concave groove 112, and thus the movement member 131 moves to the right side. By contrast, if the driving shaft 135 is rotated counterclockwise, the rack coupling portion 134 is, for example, pulled toward the side wall of the concave groove 112, and thus the movement member 131 moves to the left side. The amount of movement of the movement member 131 is, for example, in proportion to the amount of rotation of the driving shaft 135. In accordance with the rotation direction and the amount of rotation of the driving shaft 135, the movement direction and the amount of movement of the movement member 131 can be precisely controlled.

The movement control portion 133 may further include, for example, a guide coupling portion 136 that is installed on the side wall of the concave groove 112. The guide coupling portion 136 guides the movement of the rack coupling portion 134 through coming in surface contact with the rack coupling portion 134 in the second direction Y. For example, the rack coupling portion 134 may include at least one first horizontal portion 134b that projects toward the driving shaft 135, and the guide coupling portion 136 may include at least one second horizontal portion 136a that comes in surface contact with the first horizontal portion 134b in the second direction Y.

The first horizontal portion 134b and the second horizontal portion 136a may be provided as, for example, pairs. In this case, the rack 134a may be formed, for example, inside any one of a pair of first horizontal portions 134b. Further, any one of a pair of second horizontal portions 136a may come in surface contact with the first horizontal portion 134b from the outside of the first horizontal portion 134b, and the other of the second horizontal portions 136a may come in surface contact with the first horizontal portion 134b from the inside of the first horizontal portion 134b.

The configuration of the movement control portion 133 is not limited to the above-described example, and any configuration can be applied in so far as it can make the movement member 131 slide in the second direction Y in the concave groove 112.

Each of a plurality of welding portions 140 may include, for example, a first welding portion 141 and a second welding portion 142, and may be formed by spot welding or laser welding. For example, the first welding portion 141 fixes the respective projections P of the plurality of unit masks 120 and the respective movement members 131 of the plurality of extension units 130 to each other, and the second welding portion 142 fixes both end portions of the plurality of unit masks 120 and the surface 113 of the mask frame 110 to each other.

Hereinafter, the plurality of unit masks which have various arrangement forms and are applied to the above-described mask assembly 100 will be described in more detail.

Figure 7:
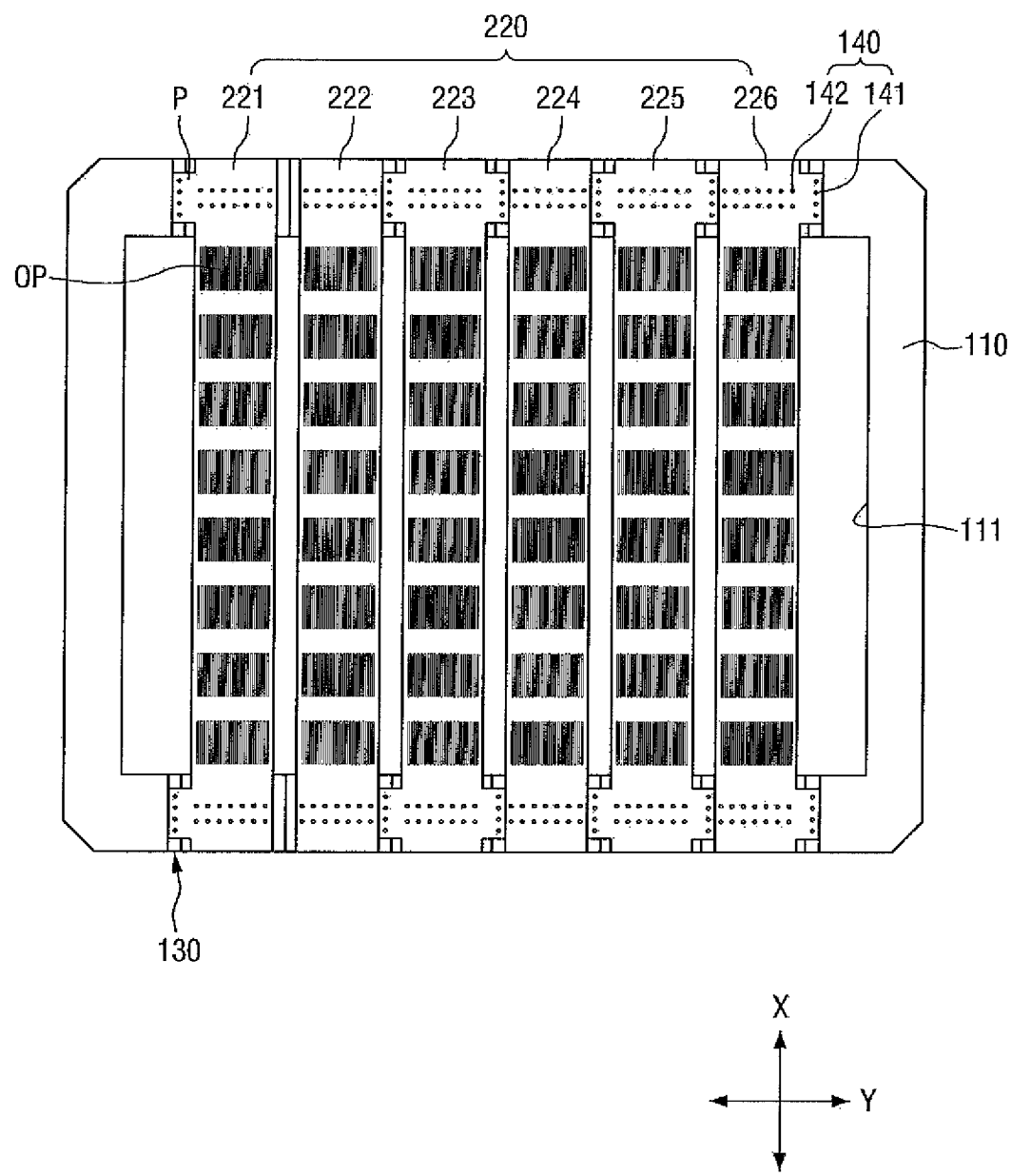
FIGS. 7 and 8 are plan views of a mask frame according to an embodiment of the present invention.
Figure 8:
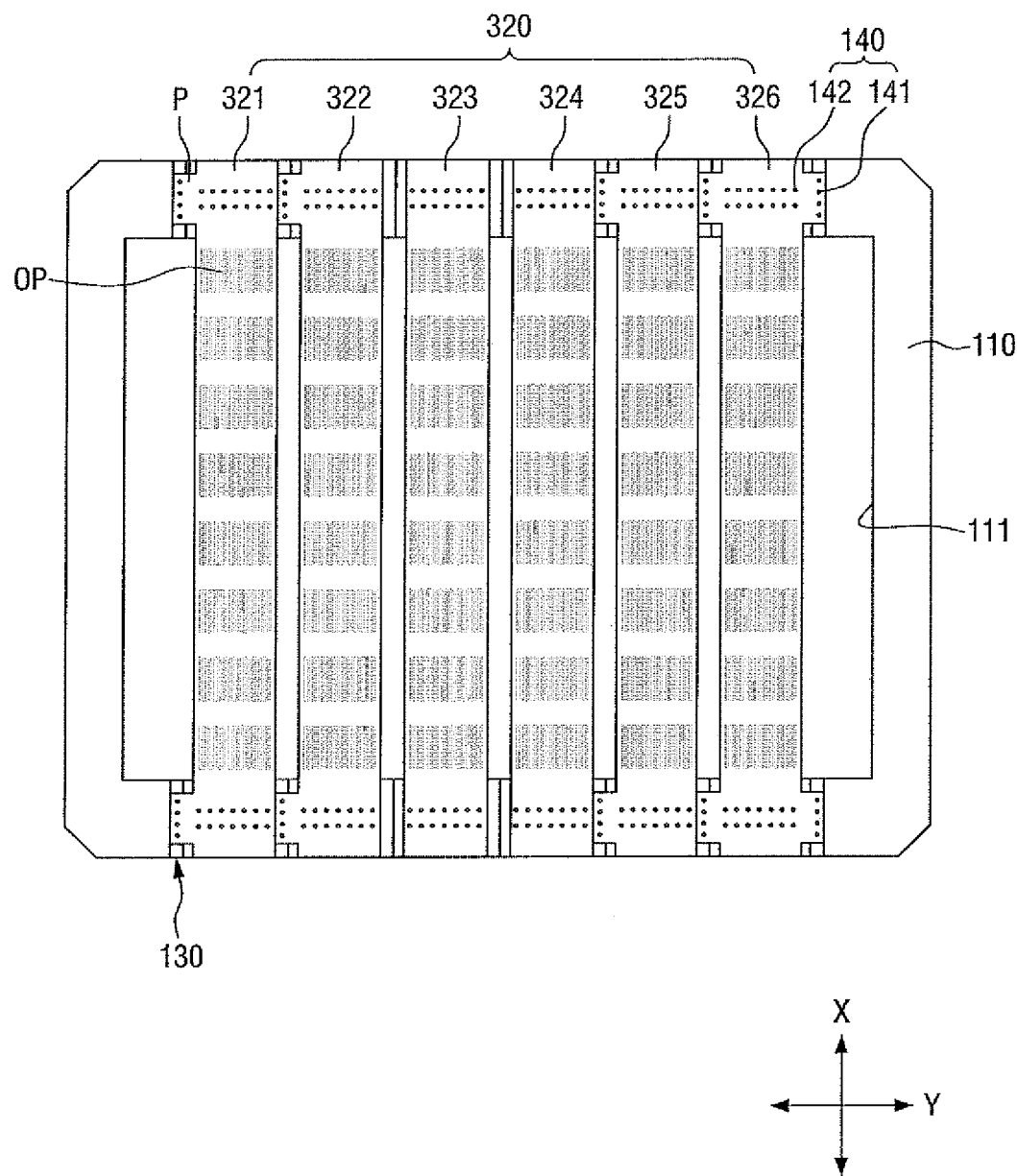

FIGS. 7 and 8 are plan views of a mask frame according to an embodiment of the present invention.

FIG. 7 exemplarily illustrates that at least parts of the plurality of unit masks 20 have a form, and the unit mask which does not include the one sided projections P and the other sided projections P and the unit mask which includes the one sided projections P and the other sided projections P are alternately arranged. For example, the plurality of unit masks 220 may include a first unit mask 221, a second unit mask 222, a third unit mask 223, a fourth unit mask 224, a fifth unit mask 225, and a sixth unit mask 226. In this case, the second unit mask 222 and the fourth unit mask 224 may be, for example, unit masks that do not include the one sided projections P and the other sided projections P, and the third unit mask 223 and the fifth unit mask 225 may be, for example, unit masks that include the one sided projections P and the other sided projections P. This arrangement may be made by, for example, coupling the first unit mask 221, the second unit mask 222, the third unit mask 223, the fourth unit mask 224, the fifth unit mask 225, and the sixth unit mask 226 to the mask frame 110 in a predetermined order rather than in regular order. The plurality of unit masks 220 illustrated in FIG. 7 may be coupled to the mask frame 110, for example, in the order of the second unit mask 222, the fourth unit mask 224, the first unit mask 221, the sixth unit mask 226, the third unit mask 223, and the fifth unit mask 225. On the other hand, the welding portion 140 that is applied to the second unit mask 222 and the fourth unit mask 224, which are unit masks that do not include the one sided projections P and the other sided projections P in FIG. 7, may include, for example, only the second welding portion 142.

FIG. 8 exemplarily illustrates that the plurality of unit masks 320 have a form, at least two of the unit mask which do not include the one sided projections P and the other sided projections P, the unit mask which include the one sided projections P, but do not include the other sided projections P, and the unit mask which includes the one sided projections P and the other sided projections P are randomly arranged. For example, the plurality of unit masks 320 may include a first unit mask 321, a second unit mask 322, a third unit mask 323, a fourth unit mask 324, a fifth unit mask 325, and a sixth unit mask 326. In this case, the third unit mask 323 and the fourth unit mask 324 may be, for example, unit masks that do not include the one sided projections P and the other sided projections P. In addition, the first unit mask 321, the second unit mask 322, and the fifth unit mask 325 may be, for example, unit masks that include the one sided projections P, but do not include the other sided projections P, and the sixth unit mask 326 may be, for example, a unit mask that includes the one sided projections P and the other sided projections P. This arrangement may be made by, for example, coupling the first unit mask 321, the second unit mask 322, the third unit mask 323, the fourth unit mask 324, the fifth unit mask 325, and the sixth unit mask 326 to the mask frame 110 in a predetermined order rather than in regular order. The plurality of unit masks 320 illustrated in FIG. 8 may be coupled to the mask frame 110, for example, in the order of the third unit mask 323, the fourth unit mask 324, the first unit mask 321, the second unit mask 322, the fifth unit mask 325, and the sixth unit mask 326. On the other hand, the welding portion 140 that is applied to the third unit mask 323 and the fourth unit mask 324, which are unit masks that do not include the one sided projections P and the other sided projections P in FIG. 8, may include, for example, only the second welding portion 142.

The mask assembly 100 according to an embodiment of the present invention as described above may effectively remove the waves by extending the plurality of unit masks 120, on which the waves occur due to the extension in the first direction, in the second direction Y. Accordingly, deformation of the respective pattern openings of the plurality of unit masks 120 due to the waves can be suppressed, and thus the deposition quality of the thin film can be increased.

Further, the mask assembly 100 according to an embodiment of the present invention fixes the projections P, which project, for example, in the second direction Y from both end portions of at least one of the plurality of unit masks 120, to the extension unit 130, and thus can stably maintain the extended state of the unit masks 120 in the second direction Y even after the forming of the mask assembly 100 is completed.

Next, a method for manufacturing a mask assembly 100 according to an embodiment of the present invention will be described.

Figure 9:
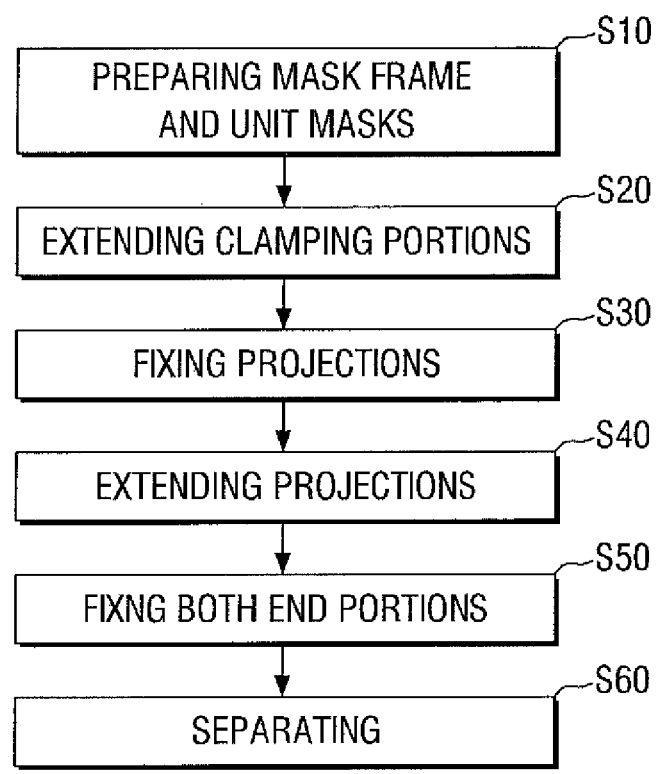
FIG. 9 is a flowchart illustrating a method for fabricating a mask assembly of FIG. 1.
Figure 10:
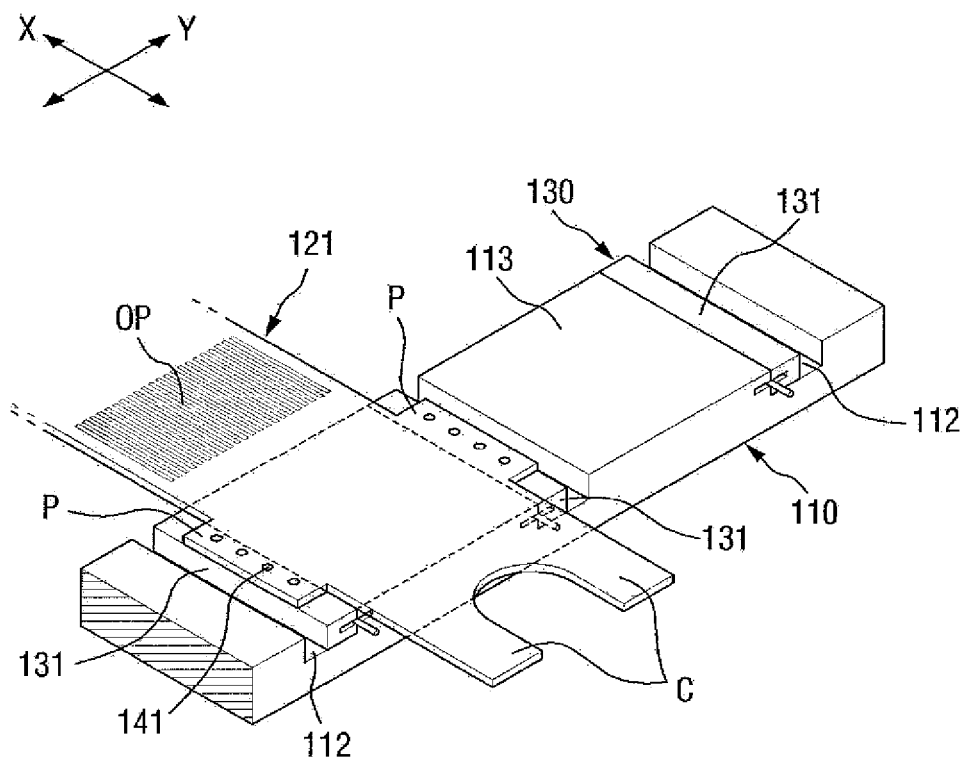
FIG. 10 is a partial perspective view illustrating projection fixing of FIG. 9.
Figure 11:
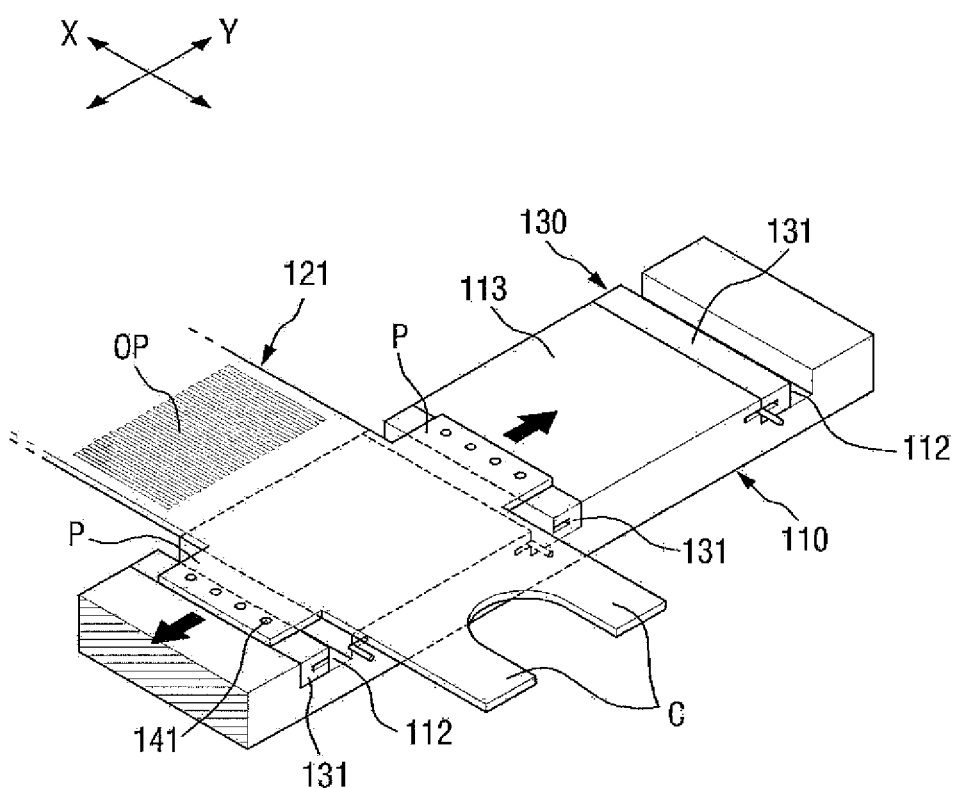
FIG. 11 is a partial perspective view illustrating projection extending of FIG. 9.
Figure 12:
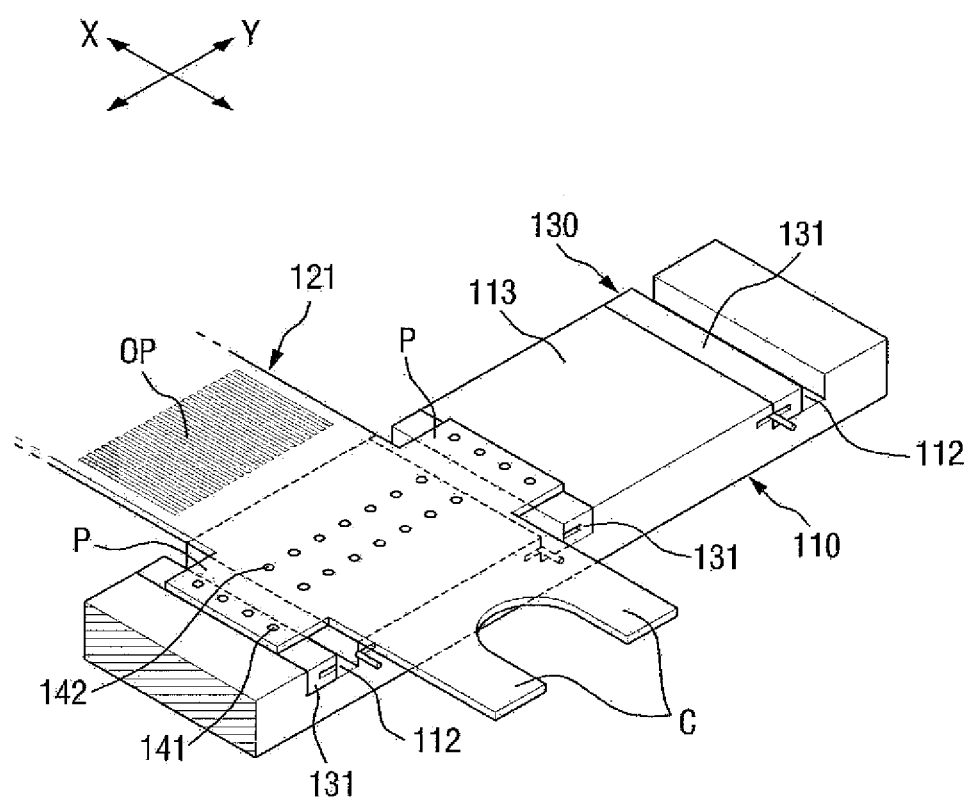
FIG. 12 is a partial perspective view illustrating both end portion fixing of FIG. 9.
Figure 13:
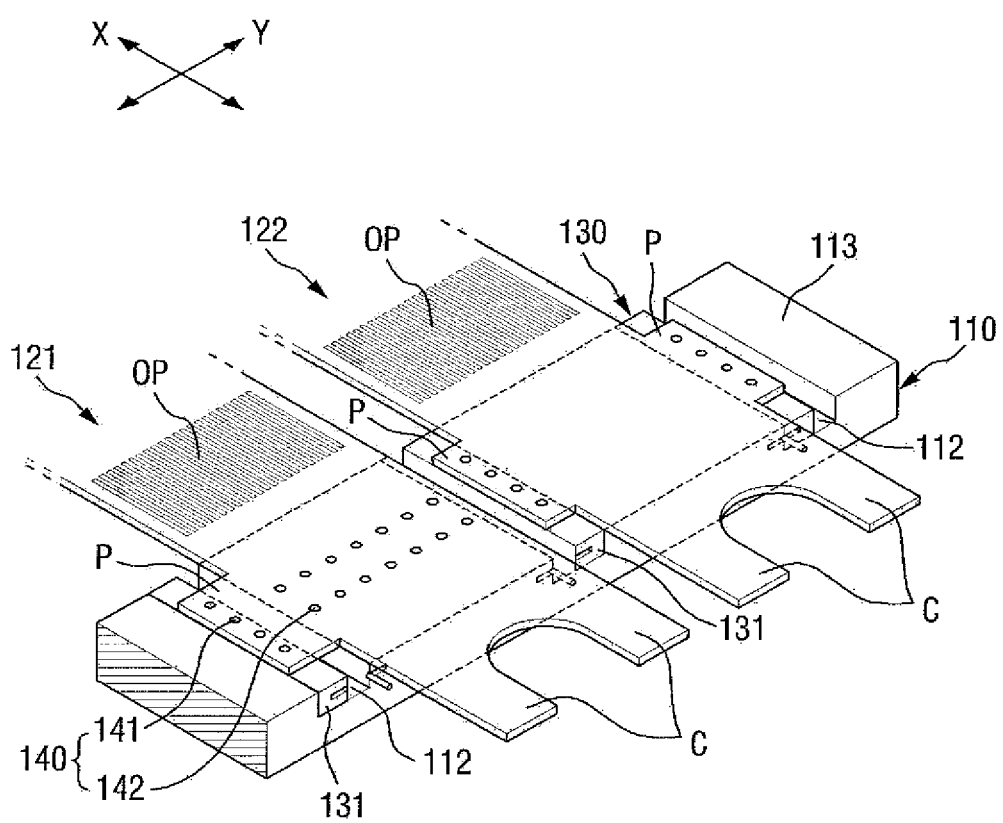
FIG. 13 is a partial perspective view illustrating separating of FIG. 9.

FIG. 9 is a flowchart illustrating a method for fabricating a mask assembly of FIG. 1. FIG. 10 is a partial perspective view illustrating projection fixing of FIG. 9, FIG. 11 is a partial perspective view illustrating projection extending of FIG. 9, FIG. 12 is a partial perspective view illustrating both end portion fixing of FIG. 9, and FIG. 13 is a partial perspective view illustrating separating of FIG. 9.

Referring to FIG. 9, a method for fabricating a mask assembly 100 according to an embodiment of the present invention may include, for example, preparing a mask frame and a plurality of unit masks (S10), extending a clamping portion (S20), fixing a projection (S30), extending the projection (S40), fixing both end portions (S50), and separating (S60).

The preparing the mask frame and the plurality of unit masks (S10) prepares the mask frame (110 in FIG. 2) and the plurality of unit masks (120 in FIG. 2). For example, the mask frame 110 on which the frame opening (111 in FIG. 2) is formed and a plurality of extension units (130 in FIG. 2) are installed in a plurality of concave grooves (112 in FIG. 2), respectively, and the plurality of unit masks 120 including the clamping portions (C in FIG. 2) projecting from both end portions thereof in the first direction X, the projections (P in FIG. 2) projecting in the second direction Y, and a plurality of openings (OP in FIG. 2) formed between the both end portions are prepared.

The extending the clamping portion (S20) extends, for example, the clamping portion (C in FIG. 2) of any one of the plurality of unit masks 120. For example, the clamping portion C of any one (e.g., 121) of the plurality of unit masks 120 is extended by a clamp (not illustrated) that applies extension force in the first direction X of the plurality of unit masks 120.

Referring to FIGS. 9 and 10, the fixing the projection (S30), for example, fixes the projection P of any one (e.g., 121) of the plurality of unit masks 120 extended in the first direction X to the extension unit 130, specifically, the movement member 131, by welding. At this time, the projection P is fixed to the movement member 131 by, for example, welding, and thus the first welding portion 141 is formed. Further, the movement member 131 is, for example, positioned closest to any one (e.g., 121) of the plurality of unit masks 120 in the concave groove 112. That is, the movement control portion (133 in FIG. 5) may determine the position of the movement member 131 so that the distance between the one side wall of the concave groove 112 toward any one (e.g., 121) of the plurality of unit masks 120 and the movement member 131 is minimized.

Referring to FIGS. 9 and 11, the extending the projection (S40), for example, extends the projection P of any one (e.g., 121) of the plurality of unit masks 120 in the second direction Y by moving the movement member 131 in the second direction Y. Accordingly, waves, which may occur on any one (e.g., 121) of the plurality of unit masks 120 in the extending the clamping portion (S20), can be removed in the extending the projection (S40).

Based on the configuration of the movement control portion 133 illustrated in FIG. 5, the movement member 131, which is positioned on the right side of the unit mask 121 based on FIG. 11, is moved to the right side by rotating the driving shaft 135 clockwise. By contrast, the movement member 131, which is positioned on the left side of the unit mask 121, is moved to the left side by rotating the driving shaft 135 counterclockwise.

As described above, by making the two movement members 131 positioned on the left and right sides of the unit mask 121 slide away from each other, the end portion of the unit mask 121 is extended in the second direction Y. As the movement direction and the amount of movement of the movement member 131 can be precisely adjusted, the extension force of the unit mask 121 for removing the waves can be minutely controlled.

Referring to FIGS. 9 and 12, the fixing the both end portions (S50), for example, fixes the both end portions of any one (e.g., 121) of the plurality of unit masks 120 extended in the second direction Y to the surface 113 of the mask frame 110 by welding. In this case, the both end portions are fixed to the surface 113 of the mask frame 110 by, for example, welding, and thus the second welding portion 142 is formed.

Referring to FIGS. 9 and 13, the separating (S60), for example, removes the clamping portion C of any one (e.g., 121) of the plurality of unit masks of which the both end portions are fixed. The removing of the clamping portion C may be performed by, for example, a cutting process using a knife. It is noted that exemplary embodiments of the present invention are not limited to a cutting process using a knife to remove the clamping portion C but rather any suitable method for removing the clamping portion C may be used as well. Further, for example, in the separating (S60), at least one projection P of any one (e.g., 121) of the plurality of unit masks 120 may be removed. The removing of the projection P may be performed by, for example, the cutting process using the knife. On the other hand, the removing of the projection P may be performed or may be omitted depending on the pattern of the projections P of the plurality of unit masks 120 of the mask assembly 100. For example, if the unit mask has no projection or has one projection in the completed mask assembly 100, a process of removing the projection P may be performed, and if the unit mask has two projections, the process of removing the projection P can be omitted. Thereafter, another unit mask (e.g., 122) may be provided beside the unit mask 121 fixed to the mask frame 110. The another unit mask (e.g., 122) may be fixed to the mask frame 110 by repeating the above-described processes of extending the clamping portion (S20), fixing the projections (S30), extending the projections (S40), fixing the both end portions (S50) and separating (S60). Here, the movement member 131 that is used to extend the projection P of the unit mask 121 in the second direction Y is, for example, also used to extend the projection P of the unit mask 122 in the second direction Y.

As described above, after one unit mask is fixed to the mask frame by the above-described processes of extending the clamping portion (S20), fixing the projections (S30), extending the projections (S40), fixing the both end portions (S50) and separating (S60), another unit mask is fixed to the mask frame by repeating the process steps (S20), (S30), (S40), (S50) and (S60) on the another unit mask to form the mask assembly 100. That is, as process steps (S20), (S30), (S40), (S50) and (S60) are repeated for each unit mask, the plurality of unit masks are fixed to the mask frame to form the mask assembly 100.

Next, a mask assembly 400 according to an embodiment of the present invention will be described.

Figure 14:
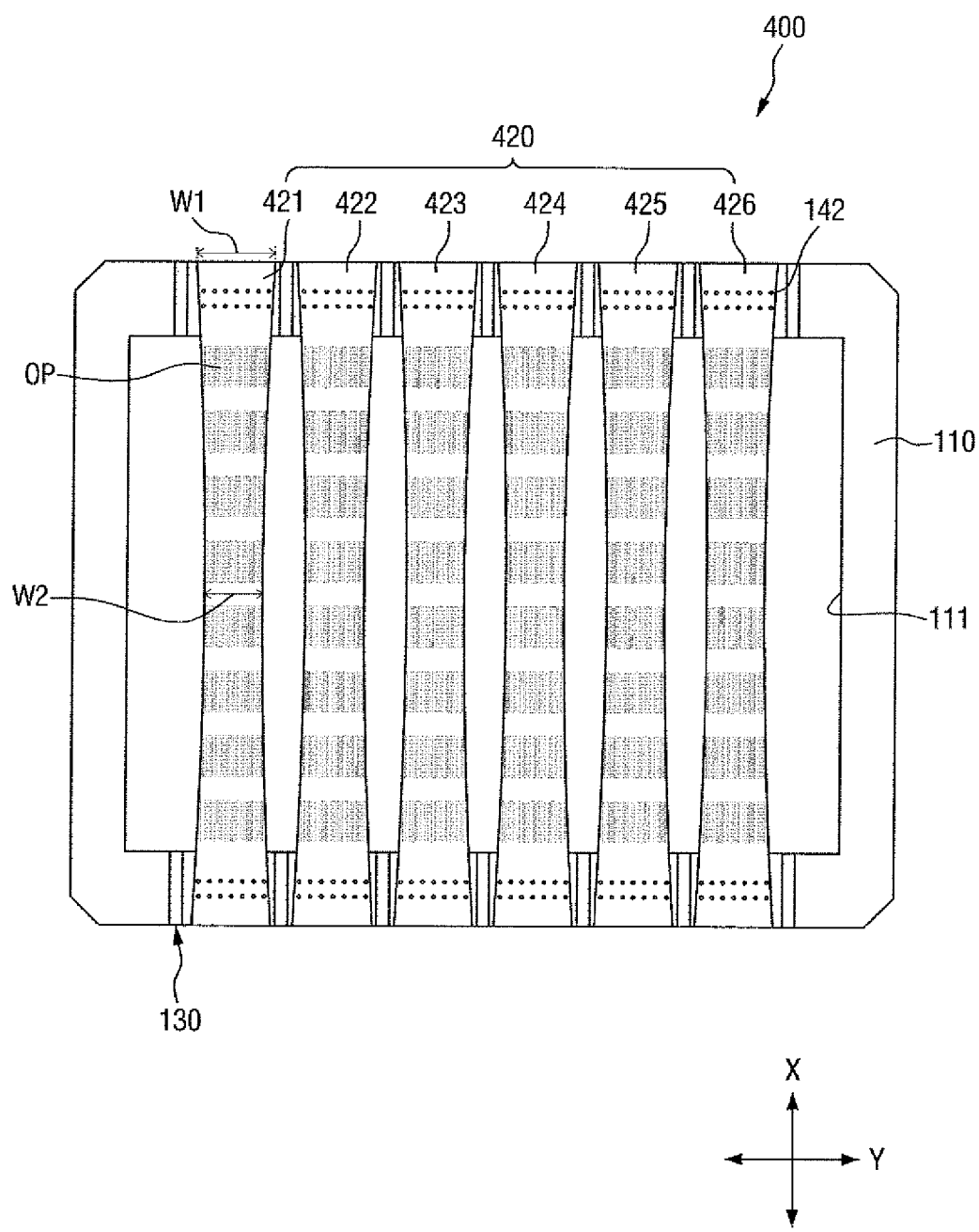
FIG. 14 is a plan view of a mask assembly according to an embodiment of the present invention.

FIG. 14 is a plan view of a mask assembly according to an embodiment of the present invention.

Referring to FIG. 14, a mask assembly 400 according to an embodiment of the present invention has the same configuration as the mask assembly 100 of FIG. 1, except that a plurality of unit masks 420 have a different shape. Accordingly, the mask assembly 400 according to the present embodiment of the present invention will be described around the plurality of unit masks 420.

The plurality of unit masks 420 include, for example, a first unit mask 421, a second unit mask 422, a third unit mask 423, a fourth unit mask 424, a fifth unit mask 425, and a sixth unit mask 426, and are similar to the plurality of unit masks 120 in FIG. 1. However, in each of the unit masks 420, the width W1 of the outermost portion in the first direction X is, for example, larger than the width W2 of a center portion. This may correspond to a case where the clamping portions (see C in FIG. 2) of the plurality of unit mask 420 are strongly extended by the clamps (not illustrated). Further, in each of the unit masks 420, the side in the first direction X may be, for example, in a parabolic form. Further, each of the unit masks 420 may be, for example, a concave form in the second direction Y.

Further, in each of the plurality of unit masks 420, not only the clamping portions (see C in FIG. 2) but also the projections (see P in FIG. 2) are, for example, all cut and separated from the plurality of unit masks 420 in the manufacturing process, and thus the completed mask assembly 400 has no projection.

As described above, according to the mask assembly 400 according to the present embodiment of the present invention, the waves can be effectively removed by extending the plurality of unit masks 420, on which the waves occurs due to the extension in the first direction X, in the second direction Y. Accordingly, the deformation of the pattern openings OP of the plurality of unit masks 420 due to the waves can be suppressed, and thus the deposition quality of the thin film can be increased.

In the method for fabricating the mask assembly 400 according to the present embodiment, substantially the same steps as those of the method for fabricating the mask assembly 100 according to an embodiment of the present invention are applied.

However, according to the method for fabricating the mask assembly 400 according to the present embodiment of the present invention, the respective clamping portions (see C in FIG. 2) of the plurality of unit masks 420 are strongly extended by the clamps (not illustrated) in the extending the clamping portions. Further, not only the clamping portions (see C in FIG. 2) but also the projections (see P in FIG. 2) of the plurality of unit masks 420 are, for example, all cut and separated from the plurality of unit masks 420, respectively, in the separating.

Next, a mask assembly 500 according to an embodiment of the present invention will be described.

Figure 15:
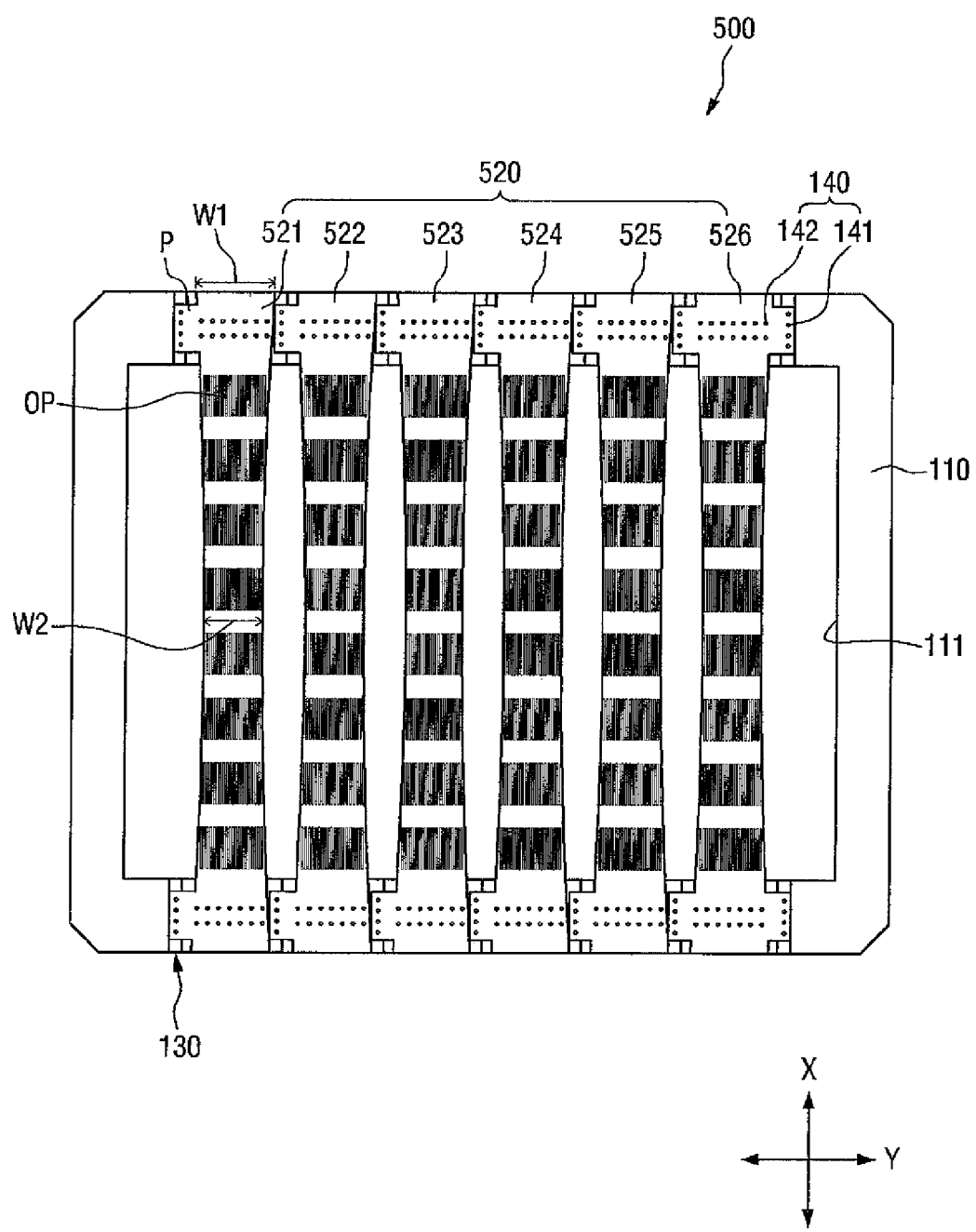
FIG. 15 is a plan view of a mask assembly according to an another embodiment of the present invention.

FIG. 15 is a plan view of a mask assembly according to an embodiment of the present invention.

Referring to FIG. 15, a mask assembly 500 according to the present embodiment of the present invention has the same configuration as the mask assembly 100 of FIG. 1, except that a plurality of unit masks 520 have a different shape. Accordingly, the mask assembly 500 according to the present embodiment of the present invention will be described around the plurality of unit masks 520.

The plurality of unit masks 520 include, for example, a first unit mask 521, a second unit mask 522, a third unit mask 523, a fourth unit mask 524, a fifth unit mask 525, and a sixth unit mask 526, and like the plurality of unit masks 120 of FIG. 1, at least one of the plurality of unit masks 520 may include, for example, at least one projection P projecting in the second direction Y from the both end portions. However, in the plurality of unit masks 520, the width of the outermost portion in the first direction X is, for example, larger than the width of a center portion. This may correspond to a case where the clamping portions (see C in FIG. 2) of the plurality of unit mask 520 are strongly extended by the clamps (not illustrated). Further, in each of the unit masks 520, the side in the first direction X may be, for example, in a parabolic form. Further, each of the unit masks 520 may be, for example, a concave form in the second direction Y.

As described above, according to the mask assembly 500 according to the present embodiment of the present invention, the waves can be effectively removed by extending the plurality of unit masks 520, on which the waves occurs due to the extension in the first direction X, in the second direction Y. Accordingly, the deformation of the pattern openings OP of the plurality of unit masks 520 due to the waves can be suppressed, and thus the deposition quality of the thin film can be increased.

Further, according to the mask assembly 500 according to the present embodiment of the present invention, as the projections P projecting in the second direction Y form the both end portions of at least one of the plurality of unit masks 520 are fixed by the extension units 130, the unit masks 520 can be stably kept in an extended state in the second direction Y even after the forming of the mask assembly 500 is completed.

On the other hand, FIG. 15 illustrates that the arrangement pattern of the projections P of the mask assembly 500 according to the present embodiment of the present invention is the same as the arrangement pattern of the projections P of the mask assembly 100 of FIG. 1. However, alternatively, the arrangement pattern of the projections P of the mask assembly 500 may be the same as the arrangement pattern of the projections P in FIGS. 7 and 8.

In the method for fabricating the mask assembly 500 according to the present embodiment, substantially the same steps as those of the method for fabricating the mask assembly 100.

However, according to the method for fabricating the mask assembly 500 according to the present embodiment of the present invention, the respective clamping portions (see C in FIG. 2) of the plurality of unit masks 520 are strongly extended by the clamps (not illustrated) in the extending the clamping portions.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A mask assembly comprising:
a mask frame; and
a plurality of unit masks fixed to the mask frame,
wherein the respective unit masks extend in a first direction, and wherein at least one of the plurality of unit masks includes at least one of a one sided projection projecting to one side thereof and another sided projection projecting to another side thereof at both end portions of the unit mask, in a second direction that crosses the first direction,
wherein the respective unit masks are spaced apart from each other, at narrowest portions thereof, in the second direction by a distance greater than or equal to a length of the projection in the second direction, as measured from the narrowest portions of the masks,
and
wherein the projection is fixed to the mask frame.

2. The mask assembly of claim 1, wherein the plurality of unit masks include a first unit mask and a second unit mask that is disposed neighboring the first unit mask.

3. The mask assembly of claim 2, wherein the first unit mask includes the one sided projection at the one end portion thereof, and the second unit mask does not include the another sided projection at the one end portion thereof.

4. The mask assembly of claim 2, wherein the second unit mask includes the another sided projection at the one end portion thereof, and the first unit mask does not include the one sided projection at the one end portion thereof.

5. The mask assembly of claim 1, wherein the plurality of unit masks include a first outermost unit mask and a second outermost unit mask that are disposed on both outermost sides of the mask frame, and wherein at least one of the first outermost unit mask and the second outermost unit mask includes both the one sided projection and the another sided projection at the one end portion thereof.

6. The mask assembly of claim 1, wherein a width of the outmost portion of the unit masks in the first direction is larger than a width of a center portion of the unit masks.

7. The mask assembly of claim 6, wherein a side of the unit masks in the first direction is in a parabolic form.

8. The mask assembly of claim 6, wherein each of the unit masks has a concave form in the second direction.

9. The mask assembly of claim 1, further comprising a plurality of extension units disposed on the mask frame and configured to extend both end portions of the unit mask in the second direction through movement in the second direction between two neighboring unit masks among the plurality of unit masks.

10. The mask assembly of claim 9, further comprising a welding portion including a first welding portion configured to fix the projections and the extension units to each other by welding, and a second welding portion configured to fix the both end portions of the respective unit masks and the mask frame to each other by welding.

11. A mask assembly comprising:
a mask frame;
a plurality of unit masks fixed to the mask frame; and
a plurality of extension units disposed on the mask frame and configured to extend both end portions of the unit mask in the second direction through movement in the second direction between two neighboring unit masks among the plurality of unit masks,
wherein the respective unit masks extend in a first direction, and wherein at least one of the plurality of unit masks includes at least one of a one sided projection projecting to one side thereof and another sided projection projecting to another side thereof at both end portions of the unit mask, in a second direction that crosses the first direction,
wherein the respective unit masks are spaced apart from each other in the second direction,
wherein a projection length of the projection is no greater than a separation distance between neighboring unit masks,
wherein the projection is fixed to the mask frame,
wherein the mask frame has a concave groove in a side thereof and each of the extension units of the plurality of extension units includes:
a guide rail disposed in a line in the second direction on a bottom of the concave groove;
a movement member coupled to the guide rail; and
a movement control portion disposed on a sidewall of the movement member and configured to control movement of the movement member,
wherein the movement member is coupled to the guide rail and is configured to slide in the second direction within the concave groove, and
wherein the movement control portion includes a rack coupling portion having a rack and a driving shaft having a pinion configured engage with the rack, and a guide coupling portion disposed on sidewall of the concave groove and configured to guide the movement of the rack coupling portion by coming in surface contact with the rack coupling portion in the second direction.

* * * * *